US006940322B2

(12) United States Patent
Yang et al.

(10) Patent No.: US 6,940,322 B2
(45) Date of Patent: Sep. 6, 2005

(54) HIGH SPEED PHASE LOCKED LOOP

(75) Inventors: Dong-Jun Yang, Gainesville, FL (US); Kenneth O, Gainesville, FL (US)

(73) Assignee: University of Florida Research Foundation, Inc., Gainesville, FL (US)

(*) Notice: Subject to any disclaimer, the term of this patent is extended or adjusted under 35 U.S.C. 154(b) by 0 days.

(21) Appl. No.: 10/459,910

(22) Filed: Jun. 12, 2003

(65) Prior Publication Data

US 2004/0251937 A1 Dec. 16, 2004

(51) Int. Cl.$^7$ ................................................. H03L 7/06
(52) U.S. Cl. ..................................... 327/147; 327/156
(58) Field of Search ................................ 327/156, 155, 327/154, 148, 147, 160, 162, 151, 115, 117; 331/17, 25; 375/373, 375, 376; 377/47, 48

(56) References Cited

U.S. PATENT DOCUMENTS

| | | | | |
|---|---|---|---|---|
| 5,937,338 | A | * | 8/1999 | Tomita ..................... 455/161.2 |
| 5,963,071 | A | * | 10/1999 | Dowlatabadi ................ 327/175 |
| 6,219,397 | B1 | * | 4/2001 | Park ........................... 375/376 |
| 6,542,043 | B1 | * | 4/2003 | Cao ...................... 331/117 FE |
| 6,583,674 | B2 | * | 6/2003 | Melava et al. ................ 331/16 |
| 2002/0000843 | A1 | * | 1/2002 | Lee ............................. 327/65 |

OTHER PUBLICATIONS

Musicer et al., "MOS Current Mode Logic for Low Power, Low Noise CORDIC Computation in Mixed–Signal Environments," Low Power Electronics and Design, Proceedings of the 2000 International Symposium 102–107, Jul. 2000.
Hung et al., "Fully Integrated 5.35–GHz CMOS VCOs and Prescalers," IEEE Transactions on Microwave Theory and Techniques, 49:17–22, 2001.

Yan et al., "A High–Speed CMOS Dual–Phase Dynamic–Pseudo NMOS ((DP)2) Latch and Its Application in a Dual–Modulus Prescaler," IEEE J. of Solid–State Circuits, 34:1400–1404, 1999.
Yamashina et al., "An MOS Current Mode Logic (MCML) Circuit for Low–Power Sub–GHz Processors," IEICE Trans. Electron. E75–C:1181–1187, 1992.
Hung et al., "A Fully Integrated 1.5–V 5.5–GHz CMOS Phase–Locked Loop", J. of Solid–State Circuits, 37:521–525, 2002.
Gardner, F., "Charge–Pump Phase–Lock Loops." IEEE Transactions on Communication COM–28:1849–1858, 1980.
Yang, D.J., et al., "A Monolithic CMOS 10.4–GHz Phase Locked Loop", 2002 Sym. on VLSI Circ., IEEE, pp. 36–38, (2002), (Jun. 13, 2002).
Floyd, B.A. et al., "A 15–GHz Wireless Interconnect Implemented in a 0.18/spi mu/m CMOS Technology Using Integrated Transmitters, Receivers, and Antennas" (Cont. below).
(Cont. from above), 2001 Sym. on VLSI Circuits, pp. 155–158, (Jun. 14, 2001).

* cited by examiner

Primary Examiner—Linh My Nguyen
(74) Attorney, Agent, or Firm—Akerman Senterfitt

(57) ABSTRACT

A high speed CMOS phase locked loop (PLL) (10) includes a three-state phase detection circuit having a frequency phase detector (12) coupled to a charge pump (14) for monitoring the phase differences between a reference frequency signal and a divided output frequency signal. The PLL can further include a loop filter (16) coupled to the three-state phase detection circuit, a VCO (18) coupled to the output of the loop filter, a VCO buffer (22) coupled to the output of the VCO for providing an output frequency signal, and a dual modulus prescaler (28) having a synchronous counter (27 and 29) using feedback among D flip-flops (30 and 32) for generating the divided output frequency signal.

16 Claims, 6 Drawing Sheets

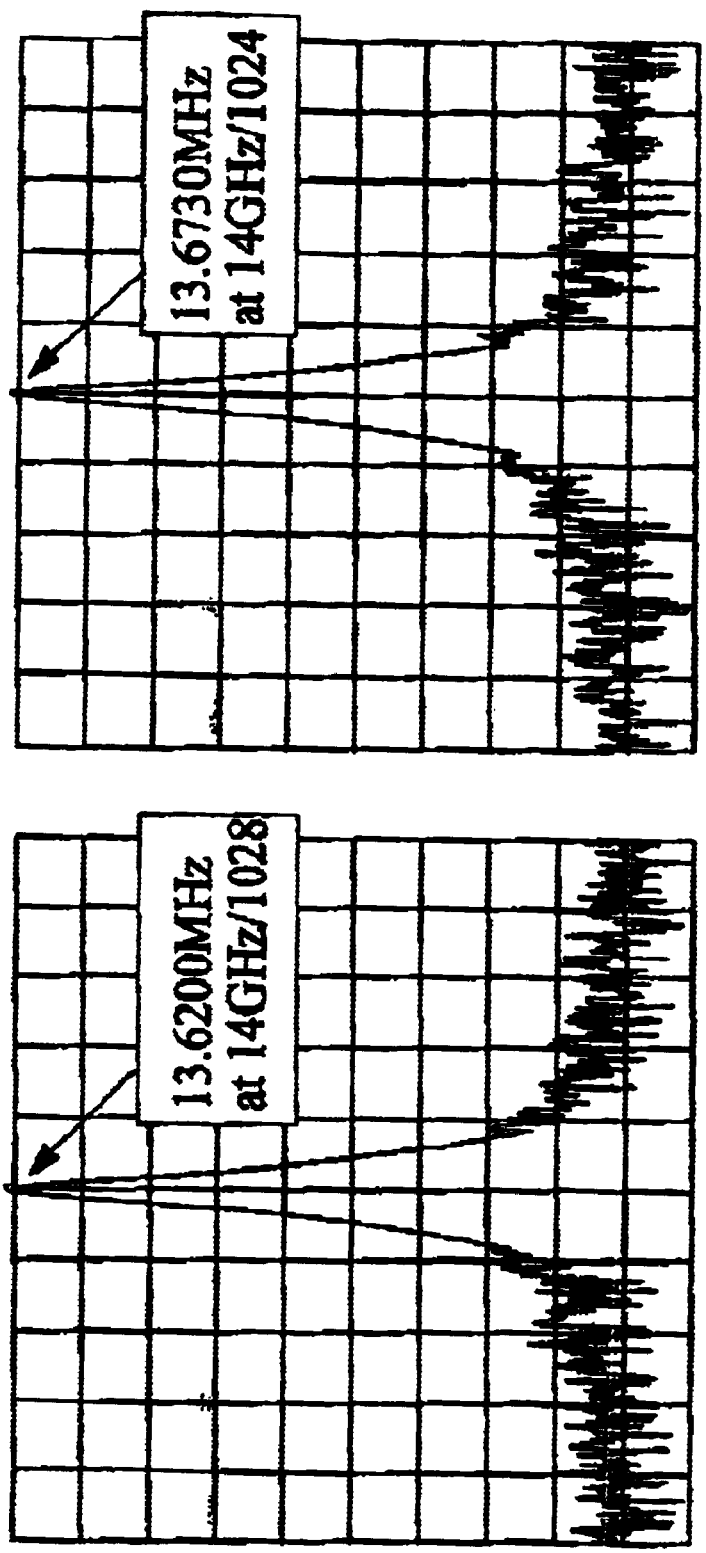

HIGH SPEED PHASE LOCKED LOOP

BACKGROUND OF THE INVENTION

1. Technical Field

This invention relates to the field of phase locked loops and more particularly to high speed phase locked loops (PLLs).

2. Description of the Related Art

A phase locked loop typically has three core components, namely, a phase detector or multiplier, a loop filter and a voltage controlled oscillator (VCO). PLLs can also include a prescaler. For a given technology, a PLL dual modulus prescaler usually sets the upper limit on the maximum operating frequency. Existing PLL architectures and dual-modulus prescaler architectures fail to enable the maximum potential frequency limits of operation for the PLL and prescaler while also maintaining other desirable PLL performance parameters.

A CMOS high-speed PLL would ideally include other characteristics that are not readily achievable with existing technology while operating at a maximum frequency. Namely, such PLL would ideally operate at a low voltage, draw a small current, have minimal phase noise for the PLL and VCO, and further have a small footprint in terms of chip size.

Thus, a need exists for a PLL and a prescaler that can operate at a high frequency and overcome the detriments described above.

SUMMARY OF THE INVENTION

Embodiments in accordance with the invention can include a CMOS phase locked loop (PLL) which operates above 10 GHz. The PLL can be fabricated in a 0.18-$\mu$m CMOS technology that operates with $V_{DD}$=1.8V, although the present invention is not necessarily limited thereto. For example, the invention can be practiced using other process technologies such as NMOS, Bi-CMOS, and Bi-Polar technologies, and/or using different (e.g., smaller) feature size processes. The PLL can incorporate a 256/257 dual modulus with feedback in a divider to attain a 14+ GHz maximum operating frequency. This is the highest operating frequency for CMOS dual modulus prescalers.

In a first aspect of the invention, a high speed phase locked loop comprises a phase detection circuit for monitoring the phase differences between a reference frequency signal and a divided output frequency signal, a loop filter coupled to the phase detection circuit, a VCO coupled to the output of the loop filter, a VCO buffer coupled to the output of the VCO for providing an output frequency signal, and a dual modulus prescaler having a synchronous counter using feedback for generating the divided output frequency signal. The phase detection circuit can be a three-state phase detection circuit including a phase frequency detector coupled to a charge pump. The dual modulus prescaler can include a 256/257 dual modulus prescaler further having a 4/5 synchronous divider. The 4/5 synchronous divider can further include a plurality of differential D flip-flops linked by forward signal paths and backward feedback paths. The backward feedback paths can be used to reduce a signal amplitude of the differential D flip-flops.

In a second aspect of the invention, a dual modulus prescaler can include a synchronous divider using feedback and a plurality of differential D flip-flops within the synchronous divider and linked by forward signal paths and backward feedback paths for generating a high-speed divided output frequency signal.

In a third aspect of the invention, a method of obtaining a high operating frequency phase locked loop can include the steps of receiving a reference frequency signal, generating an output frequency signal, buffering the output frequency signal, dividing the output frequency signal using a dual modulus prescaler having a synchronous counter using feedback for generating a divided output frequency, monitoring a plurality of phase differences between the reference frequency signal and the divided output frequency signal, and filtering the divided output frequency signal.

BRIEF DESCRIPTION OF THE DRAWINGS

There are shown in the drawings embodiments which are presently preferred, it being understood, however, that the invention is not limited to the precise arrangements and instrumentalities shown.

FIG. 6 illustrates the output spectra of the prescaler and divide by 4 circuit of FIG. 1 in accordance with the present invention.

DETAILED DESCRIPTION OF THE INVENTION

Figure 1:
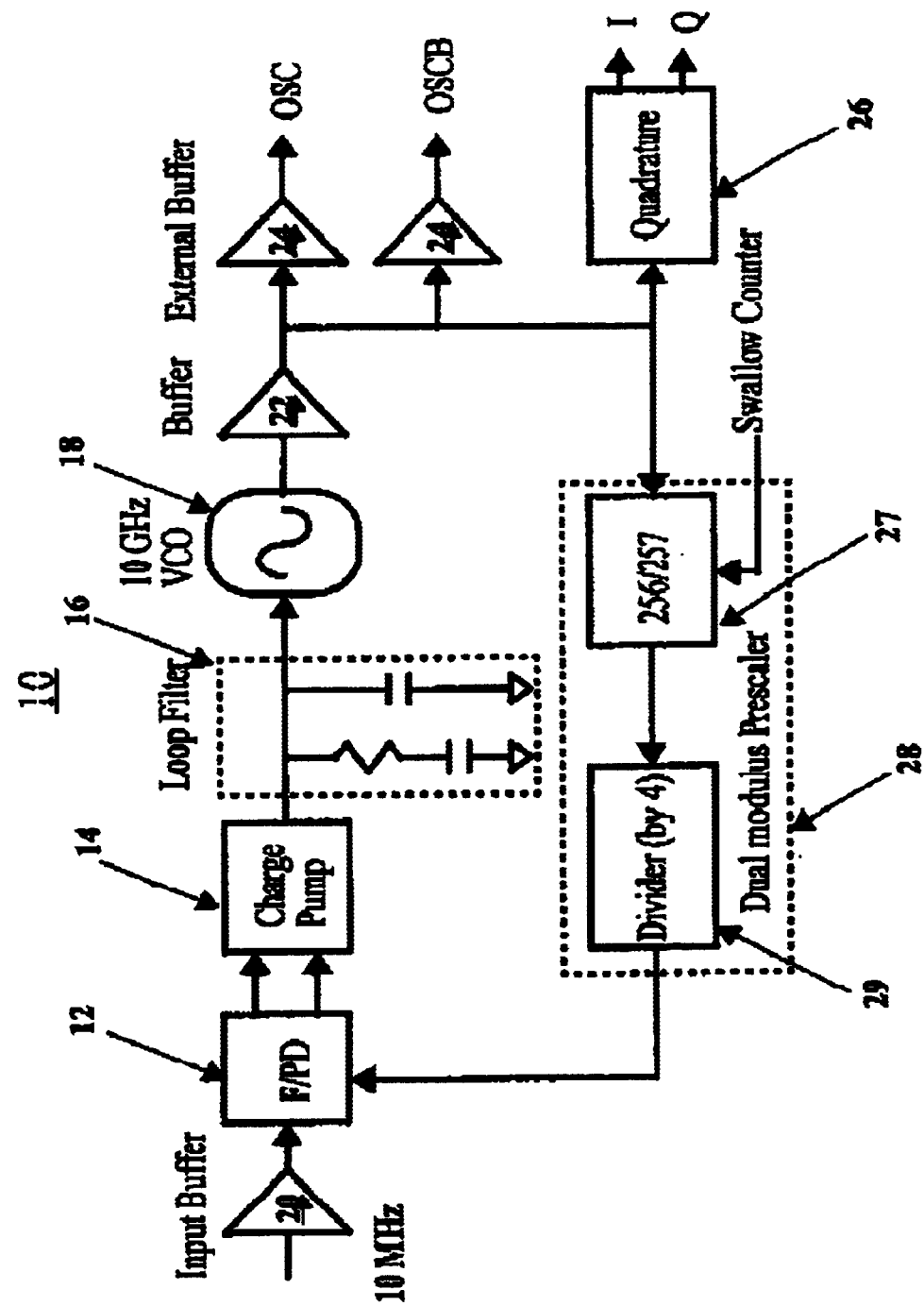
FIG. 1 is a block diagram of a phase locked loop in accordance with the present invention.
Figure 5:
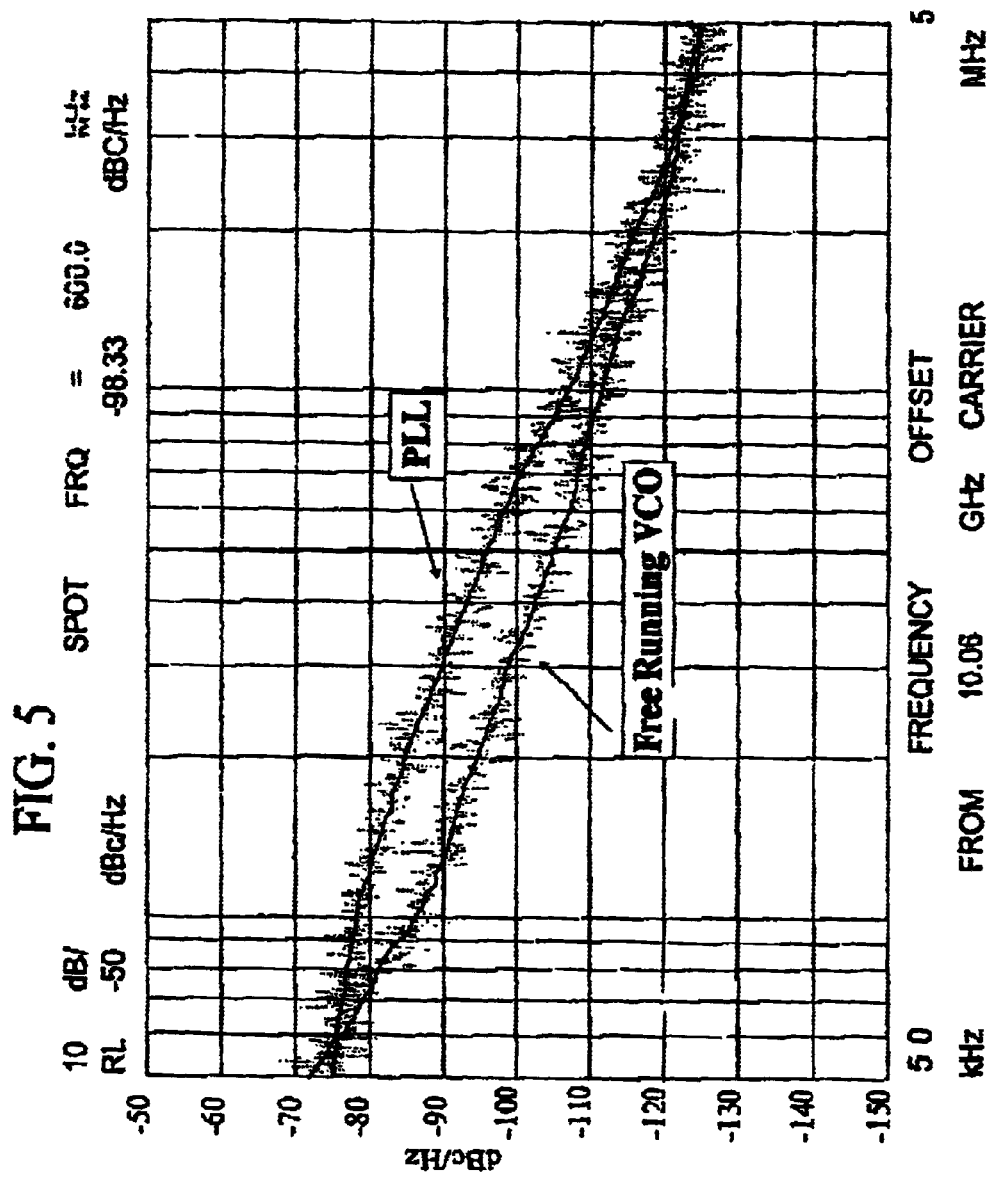
FIG. 5 is a chart illustrating the phase noise of the phase locked loop and VCO of FIG. 1.

Embodiments in accordance with the invention as shown in FIG. 1 can include a PLL 10 such as a 10.4-GHz PLL with a dual modulus prescaler 28 such as a 256/257 dual modulus prescaler implemented in a 0.18-$\mu$m CMOS process. The prescaler 28 can include a divider or counter 29 such as a 4/5 synchronous counter that can operate up to 14 GHz and potentially higher. The counter 29 achieves this by using feedback. The phase noise levels of the PLL and VCO at a 3-MHz offset with $I_{vco}$=8.1 mA are −122 dBc/Hz as shown in FIG. 5. The PLL 10 can operate between 9.7 and 10.4 GHz, while drawing a low current of less than 35 mA at $V_{DD}$=1.8V, such as 34 mA.

Referring again to FIG. 1, the PLL 10 can include a voltage controlled oscillator (VCO) 18, a VCO buffer 22, a 256/257 dual modulus prescaler 28, a divider (divide by 4) 29, a phase frequency detector (FPD) 12, a charge pump 14 and a loop filter 16. The FPD 12 and charge pump 14 can use a 3 state phase detection scheme as further detailed in Floyd M. Gardner's article in IEEE transactions on Communication Electronics, pp. 1849–1858, November 1980, although the invention is not limited thereto. The loop filter 16 is 2nd order, and the PLL 10 can form a 3rd order system with a loop bandwidth of 200 kHz and a phase margin of 67 degrees. The second order loop filter 16 can include two poly-silicon-to n-well MOS capacitors and one resistor. Exemplary values of capacitors can be 227.1 pF and 12.4 pF. The reference frequency of the PLL 10 can be around 10 MHz which can be buffered by buffer 20. The PLL 10 can also include external buffers 24 used to drive external components. Although, currently not implemented, by adding buffers (not shown) to the divide by two outputs, this PLL can also be used to provide quadratures (26) for 5 GHz applications.

Figure 2:
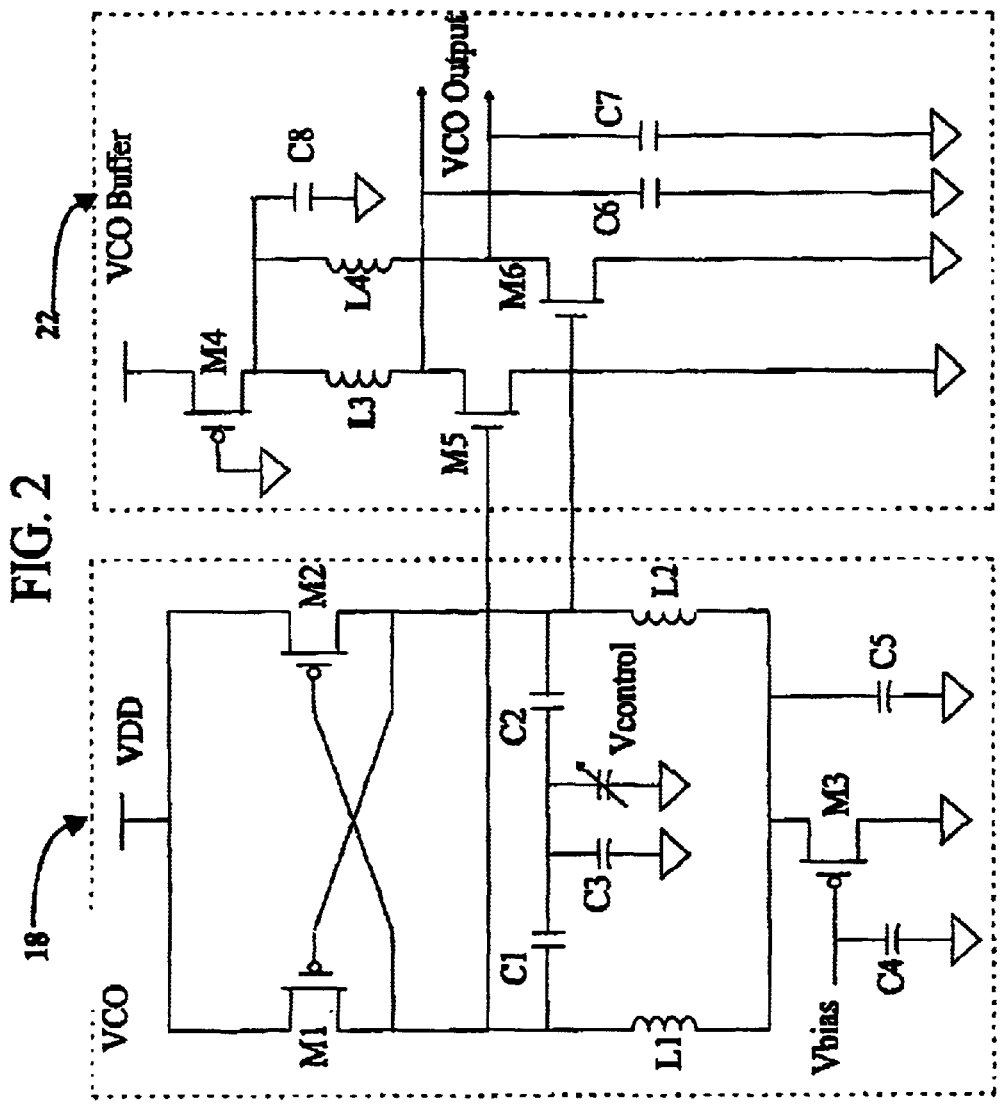
FIG. 2 is a more detailed block diagram illustrating the voltage controlled oscillator and voltage controlled oscillator buffer of FIG. 1.

Referring to FIG. 2, the VCO 18 shown can exclusively use PMOS transistors to reduced 1/f noise and hot-carrier induced white noise. In the 0.18-μm CMOS process, PMOS transistors have one order of magnitude lower 1/f noise. The VCO 18 can operate at 10.4 GHz with a 4.9 mA bias current and achieves −119 dBc/Hz at a 3-MHz offset. At 8.1 mA bias current, the phase noise at a 3-MHz offset can be −122 dBc/Hz as shown in FIG. 5. The VCO 18 can be tuned between 9.7 and 10.4 GHz or has a tuning range of about 690 MHz. To drive the quadrature generator 26 (shown in FIG. 1) and prescaler at high frequencies, a VCO buffer 22 should operate at 10.4 GHz while providing a signal swing close to rail-to-rail (about 1.5 V) is required. The buffer 22 preferably utilizes a low-Q (about 2) and an LC tank (L3, L4) (as shown in FIG. 2). The low Q is intended to achieve a broad-band response. The pull-up PMOS transistor (M4) can set the biasing point of the buffer to be around a half of $V_{DD}$ (0.9 V).

Figure 3:
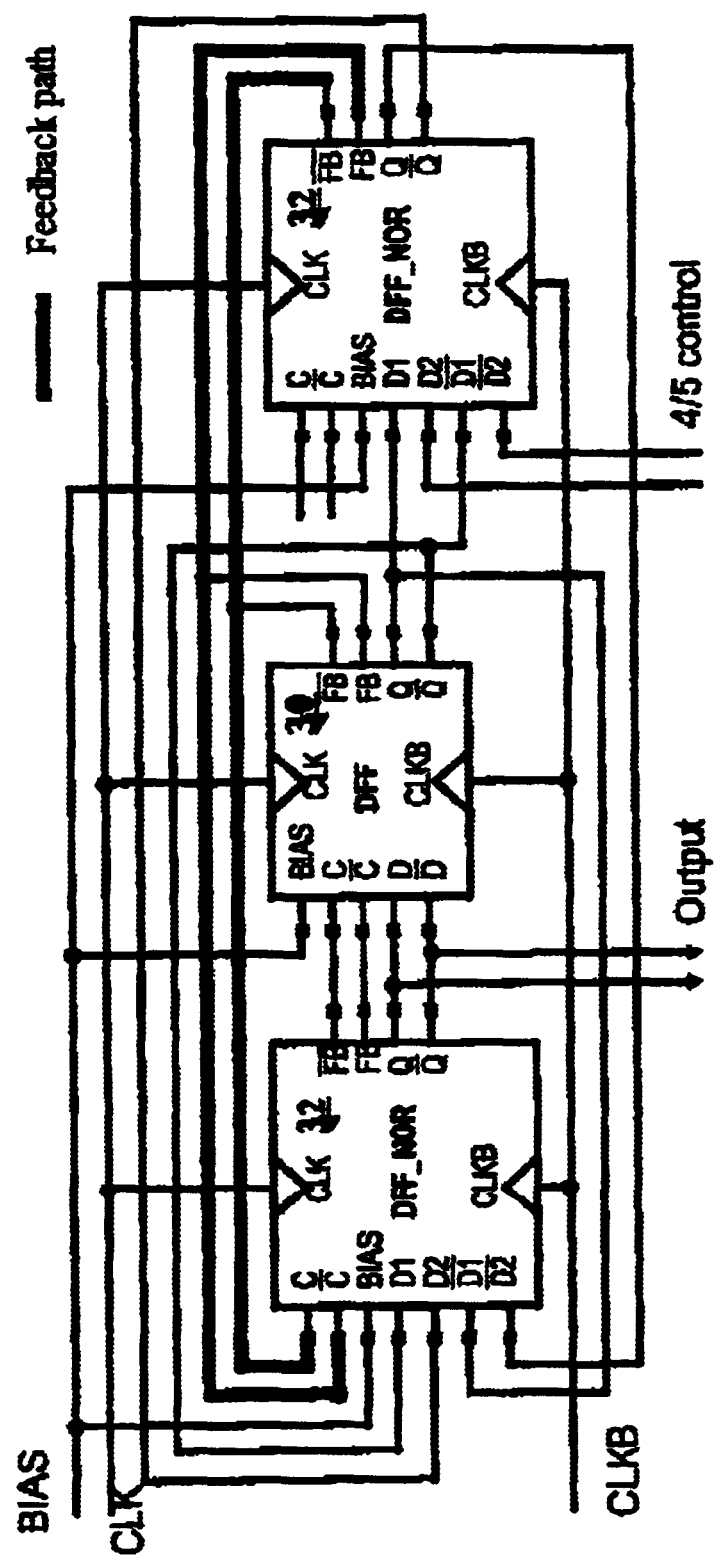
FIG. 3 is a more detailed block diagram illustrating the dual modulus divider of FIG. 1.
Figure 4:
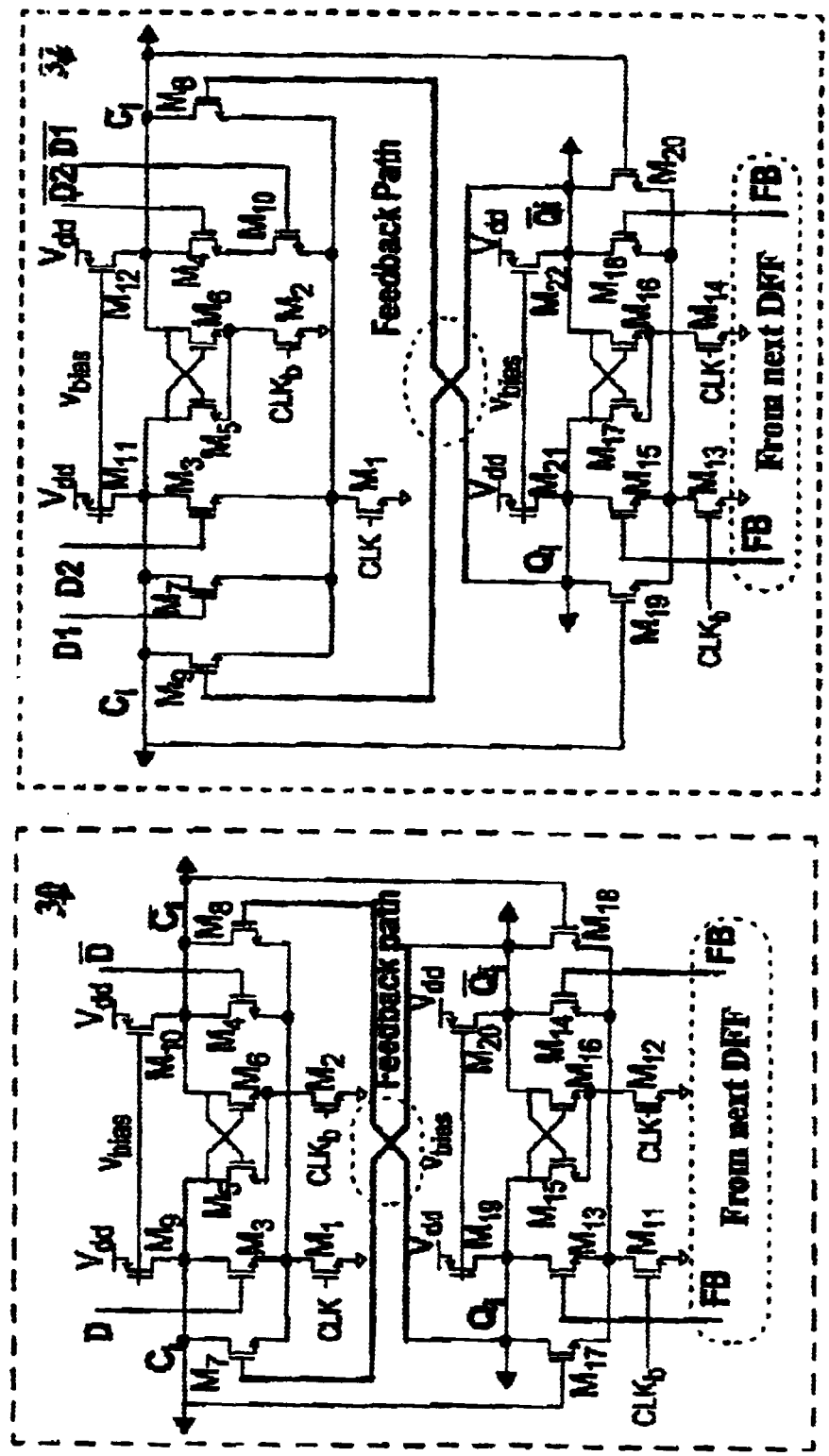
FIG. 4 is a more detailed block diagram of the D-Flip Flops of FIG. 3 and their feedback paths in accordance with the inventive arrangements disclosed herein.

For a given technology, the dual-modulus prescaler usually sets the upper limit on the maximum operating frequency. To increase the maximum operating frequency, the 4/5 synchronous divider 29 which operates at the VCO output frequency incorporates feedback as shown in FIGS. 3 and 4. The synchronous divider 29 as shown in FIG. 3 can include 3 basic differential D flip-flops (30 and 32) linked by forward signal paths and backward feedback paths as illustrated in FIG. 3. A D flip-flop 30 consisting of a 2-stage differential latch and a NOR circuit required for dual modulus operation incorporated into a D flip-flop 32 are shown in FIG. 4. The feedback is used to reduce the signal amplitude of the D flip-flops, which decreases the delay when the states of C and $\hat{C}$ or Q and $\overline{Q}$ (flipping operation) are changed.

For instance, when dividing by 5, the D flip-flops 30 and 32 sustain a high signal state during 3 cycles and a low state during 2 cycles. If there is no feedback, the high output of the D flip-flops increases during these cycles. Following this, both the NOR gate operation and the transition of the output node from Hi to LO must take place within the next half clock cycle. This becomes impossible at a sufficiently high clock frequency. Q and $\overline{Q}$ outputs of each D flip-flop are fed back to $M_8$ and $M_7$ (FIGS. 3 and 4), and C and $\hat{C}$ outputs of the following D flip-flop are fed back to the FB ($M_{13}$) and FB ($M_{14}$) of the flip-flop. Near the maximum operating frequency of the divider, during two consecutive clock cycles, if outputs of a flip-flop stay the same, C and Q which have the opposite logic states can be used to provide negative feedback to limit the growth of the output signal by reducing the output driving capability of the D flip-flops. On the other hand, if outputs of flip-flops are flipped during two consecutive clock cycles, Q and C have the same logic state and the feedback path effectively increases the transistor size of the differential input gate, which increases the output driving capability and decreases the propagation delay. The simulation suggests that the maximum operating frequency at 1.8 V can be increased to 16 GHz from 10 GHz without the feedback. The operation range of prescaler is maximized if the size of feedback transistors is about ⅓ of the transistor in the signal path.

The Frequency Phase Detector (FPD) 12 and charge pump circuit 14 shown in FIG. 1 can form a 3 state phase detection circuit. The charge pump circuit 14 can generate approximately 50-pA current pulses. This relatively small charge pump current reduces the value of the capacitors in the loop filter 16.

The output spectra of the PLL 10 and VCO 18 are shown in FIG. 5. The phase noise of the PLL and VCO at $V_{DD}$=1.8 V with $I_{vco}$=8.1 mA is −122 dBc/Hz and −122 dBc/Hz, or lower, at the 3-MHz offset respectively. In the case of $I_{vco}$=4.9 mA, they are −117 dBc/Hz and −119 dBc/Hz. The phase noise of PLL 10 at a 10 kHz offset is −80 dBc/Hz, or lower, which is excellent. The PLL 10 can operate at 10.4 GHz and the dual modulus divider can operate at 14 GHz. In FIG. 6, output spectra during the divide-by-256*4 and divide-by-257*4 operations are compared. Indeed there is an expected output frequency shift of about 53 kHz. The PLL 10 draws about 34 mA. The prescaler and FPD utilize about 19 mA. The VCO consumes 8 mA and the VCO buffers consume about 7 mA. Table 1 below summarizes the chip performance of the PLL 10 embodied in a semiconductor die. The die size can approximately be 0.875 mm×0.576 mm.

TABLE 1

Summary of PLL performance

| Parameter | PLL |
|---|---|
| Supply Voltage | 1.8 V |
| PLL Current | 34 mA |
| Tuning Range of VCO | 690 MHz (9.76–10.45 GHz) |
| Phase Noise of PLL @ 3 MHz, $f_0$ =10 GHz | −117 dBc/Hz ($I_{VCO}$ = 4.9 mA) −122 dBc/Hz ($I_{VCO}$ = 8.1 mA) |
| Phase Noise of VCO. @ 3 MHz, $f_0$ = 9.58 GHz | −119 dBc/Hz($I_{VCO}$ = 4.9 mA) −122 dBc/Hz($I_{VCO}$ = 8.1 mA) |
| Max. Frequency (Dual Modulus Prescaler) | 14 GHz (at $V_{DD}$ = 1.8 V) |
| Chip Size (mm²) | 0.875 × 0.576 |

The present invention can be realized in hardware or a combination of hardware and software. The present invention can also be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

This invention can be embodied in other forms without departing from the spirit or essential attributes thereof. Accordingly, reference should be made to the following claims, rather than to the foregoing specification, as indicating the scope of the invention.

What is claimed is:

1. A high speed phase locked loop, comprising:
   a phase detection circuit for monitoring the phase differences between a reference frequency signal and a divided output frequency signal;
   a loop filter coupled to the phase detection circuit;
   a VCO coupled to the output of the loop filter;
   a VCO buffer coupled to the output of the VCO for providing an output frequency signal; and
   a dual modulus prescaler comprising a synchronous divider disposed between an output of the VCO buffer and the phase detection circuit for generating the divided output frequency signal, the synchronous divider comprising a plurality of flip-flops having a first feedback including a dividing loop for dividing a frequency of said output frequency signal and a second feedback for reducing output signal amplitudes of said flip flops to increase speed of the dividing.

2. The phase locked loop of claim 1, wherein the phase detection circuit comprises a three-state phase detection circuit having a phase frequency detector coupled to a charge pump.

3. The phase locked loop of claim 1, wherein the dual modulus prescaler is a 256/257 dual modulus prescaler.

4. The phase locked loop of claim 1, wherein the the synchronous divider comprises a 4/5 synchronous divider.

5. The phase locked loop of claim 4, wherein said flip flops comprise a plurality of differential D flip-flops.

6. The phase locked loop of claim 5, wherein the differential D flip-flops further comprises at least one among a 2-stage differential latch and a NOR circuit.

7. The phase locked loop of claim 6, wherein the 2-stage differential latch and the NOR circuit are used for dual modulus operation of the dual modulus prescaler.

8. The phase locked loop of claim 1, wherein the VCO buffer further comprises a low Q LC tank circuit.

9. The phase locked loop of claim 1, wherein the loop filter further comprises two poly-silicon-to n-well MOS capacitors and one resistor.

10. The phase locked loop of claim 1, wherein the VCO has a tuning range of 690 MHz between the frequencies of 9.7 GHz and 10.4 GHz.

11. The phase locked loop of claim 1, wherein the dual modulus prescaler operates at a frequency up to 14 GHz.

12. The phase locked loop of claim 1, wherein the phase locked loop is implemented on a semiconductor die using at least one among a CMOS process, and NMOS process, a Bi-CMOS process, and a Bi-polar process.

13. The phase locked loop of claim 1, wherein the phase locked loop draws less than 35 mA using a 1.8 volt supply voltage while operating at a maximum frequency at or above 14 GHz.

14. The phase locked loop of claim 1, wherein the phase noise of the phase locked loop and the VCO at $V_{DD}$=1.8 V with $I_{vco}$=8.1 mA is −122 dBc/Hz, or lower, and −122 dBc/Hz, or lower, at a 3-MHz offset respectively.

15. The phase locked loop of claim 1, wherein the phase noise of the phase locked loop phase at $V_{DD}$=1.8 V and at a 10 kHz offset is −80 dBc/Hz or lower.

16. A method of obtaining a high operating frequency phase locked loop, comprising the steps of:

receiving a reference frequency signal;

generating an output frequency signal;

buffering the output frequency signal;

dividing the output frequency signal using a dual modulus prescaler comprising a synchronous divider including a plurality of flip flops for generating a divided output frequency, wherein a dividing speed of said synchronous divider is increased by feeding back outputs of the plurality of flip-flops;

monitoring a plurality of phase differences between the reference frequency signal and the divided output frequency signal; and filtering the divided output frequency signal.

* * * * *